(12) United States Patent
Kumar et al.

(10) Patent No.: US 6,436,810 B1
(45) Date of Patent: Aug. 20, 2002

(54) BI-LAYER RESIST PROCESS FOR DUAL DAMASCENE

(75) Inventors: Rakesh Kumar, Singapore (SG); Leong Tee Koh, Johor Bahru (MY); Pang Dow Foo, Singapore (SG)

(73) Assignee: Institute of Microelectronics, Singapore (SG)

( * ) Notice: Subject to any disclaimer, the term of this patent is extended or adjusted under 35 U.S.C. 154(b) by 0 days.

(21) Appl. No.: 09/671,508

(22) Filed: Sep. 27, 2000

(51) Int. Cl.[7] .......................................... H01L 21/4763
(52) U.S. Cl. ..................... 438/633; 438/637; 438/638; 438/759; 438/634; 438/618
(58) Field of Search ................. 438/633, 622, 438/723, 700, 780

(56) References Cited

U.S. PATENT DOCUMENTS

| | | | |
|---|---|---|---|
| 5,753,967 A | 5/1998 | LIn | 257/635 |
| 5,789,316 A | 8/1998 | Lu | 438/637 |
| 5,877,076 A | 3/1999 | Dai | 438/597 |
| 5,882,996 A | 3/1999 | Dai | 438/597 |
| 5,935,762 A | 8/1999 | Dai et al. | 430/312 |
| 5,936,707 A | 8/1999 | Nguyen et al. | 355/18 |
| 5,976,968 A | 11/1999 | Dai | 438/622 |
| 6,043,164 A | 3/2000 | Nguyen et al. | 438/736 |
| 6,127,070 A * | 10/2000 | Yang et al. | 430/5 |
| 6,165,898 A * | 12/2000 | Jang et al. | 438/638 |
| 6,174,801 B1 * | 1/2001 | Tzu et al. | 438/637 |
| 6,207,555 B1 * | 3/2001 | Ross | 438/633 |
| 6,265,319 B1 * | 7/2001 | Jang | 438/723 |

* cited by examiner

*Primary Examiner*—David Nelms
*Assistant Examiner*—Thao P Le
(74) *Attorney, Agent, or Firm*—George O. Saile; Stephen B. Ackerman

(57) ABSTRACT

The current invention teaches the use of e-beam patterning techniques for forming contact and via holes of diameter less than about 0.15 microns down to 0.05 microns. E-beam lithography has higher resolution (down to 30–50 nanometers) as compared to 130–150 nanometer when using deep ultra violet (DUV) photolithography patterning techniques. In addition the invention uses a mix and match approach by employing a conventional I-line, or deep UV, resist to form the trench pattern and e-beam lithography tools to form the contact and vial hole patterns. A simplified process scheme is developed where contact/via holes are formed first on solvent developable e-beam resist and the trench pattern is formed on aqueous developable photoresist coated on top of the e-beam resist.

20 Claims, 10 Drawing Sheets

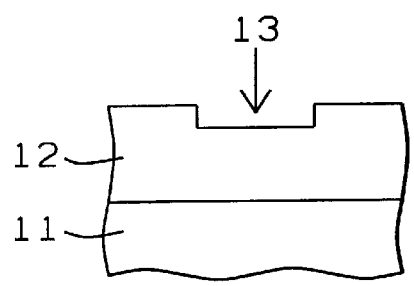
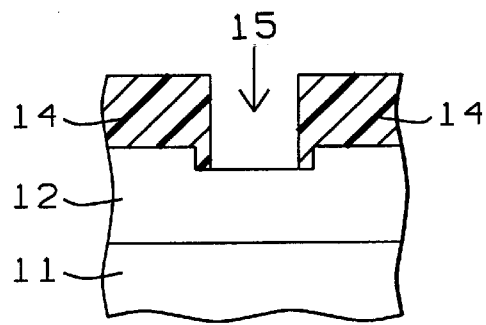
FIG. 1a – Prior Art
FIG. 1b – Prior Art
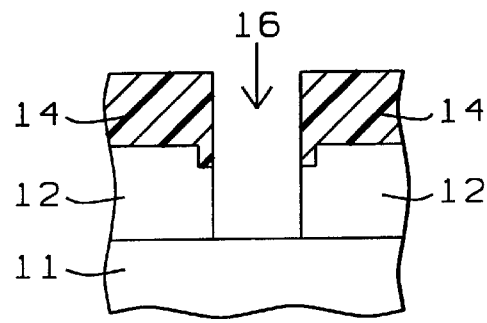
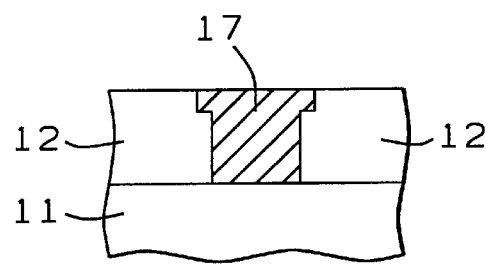
FIG. 1c – Prior Art
FIG. 1d – Prior Art
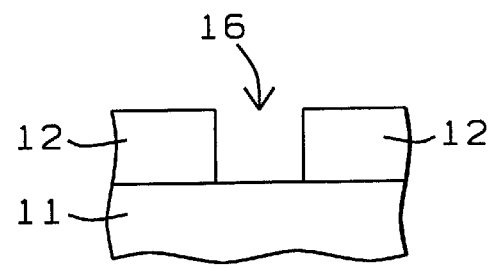
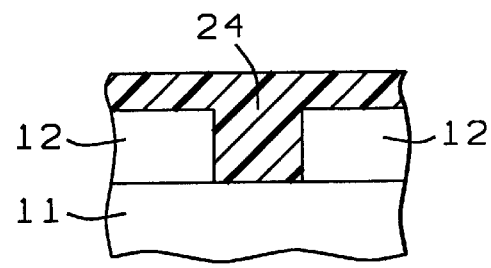
FIG. 2a – Prior Art
FIG. 2b – Prior Art

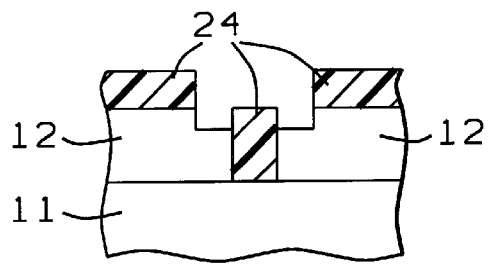
FIG. 2c – Prior Art
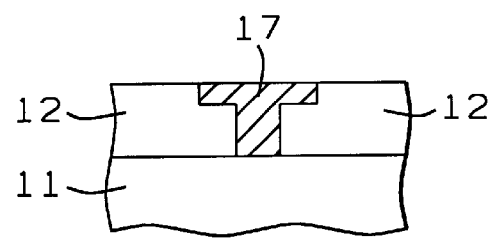
FIG. 2d – Prior Art
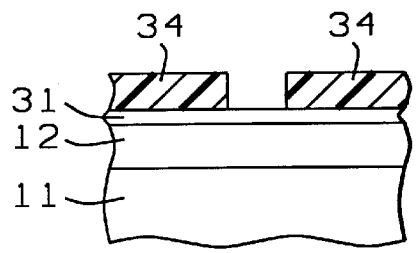
FIG. 3a – Prior Art
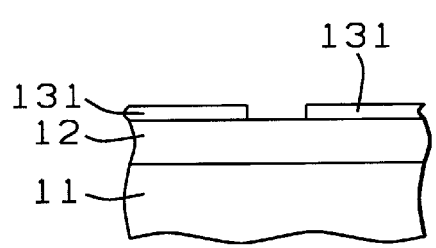
FIG. 3b – Prior Art
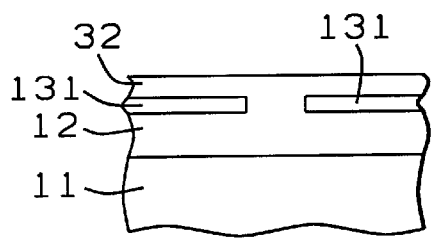
FIG. 3c – Prior Art
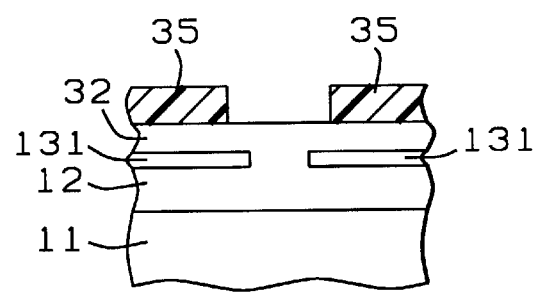
FIG. 3d – Prior Art

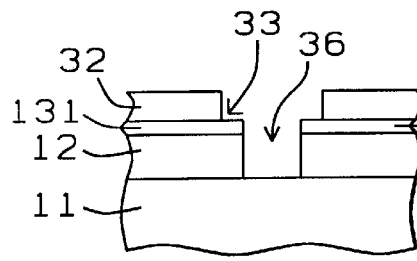
*FIG. 3e - Prior Art*
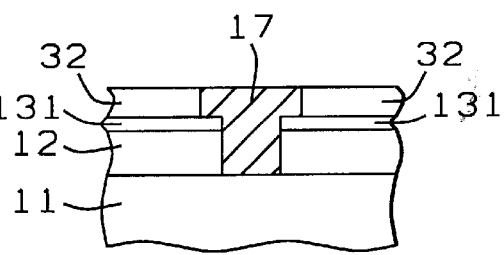
*FIG. 3f - Prior Art*
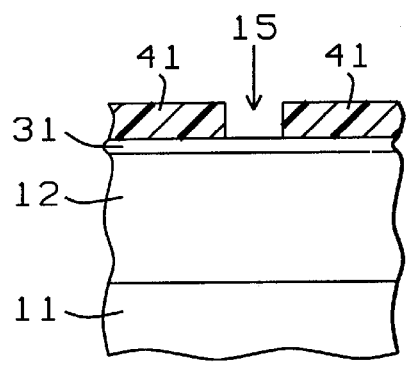
*FIG. 4a - Prior Art*
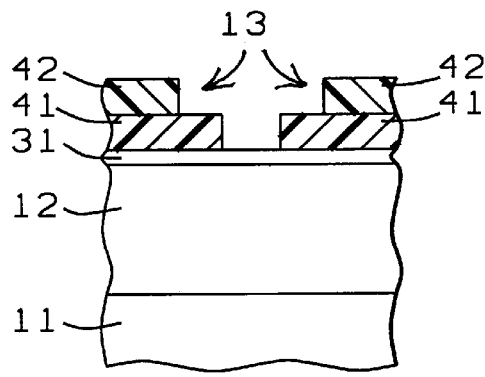
*FIG. 4b - Prior Art*
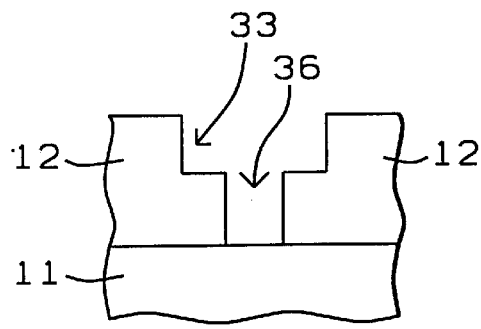
*FIG. 4c - Prior Art*
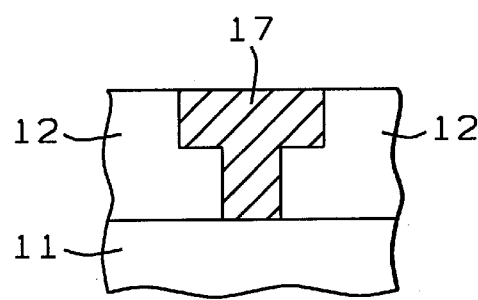
*FIG. 4d - Prior Art*

BI-LAYER RESIST PROCESS FOR DUAL DAMASCENE

FIELD OF THE INVENTION

The invention relates to the general field of photolithography with particular reference to etching damascene wiring patterns in which via hole diameters are less than about 0.15 microns.

BACKGROUND OF THE INVENTION

The invention relates to the manufacturing of Ultra Large Scale Integrated Circuits (ULSI) wherein the interconnection structures consist of inlaid conductive metal wiring and conductive contact and via holes formed using a dual damascene process. This invention describes a method of forming a dual damascene structure whose dimensions are less than those obtainable when using conventional photo lithography techniques.

Subtractive etching methods for forming interconnects have been used in the integrated circuit industry for a long time. Such methods involve formation of contact or via holes in a dielectric layer and then depositing a metal film such as aluminum or its alloy by a sputtering technique. This metal layer is then patterned using a photolithography mask and the metal is etched to form a wiring pattern. Multiple wiring pattern layers can be formed by deposition of an interlayer dielectric and connection of metal wiring by-via hole patterns.

The switch from aluminum and its alloys to copper interconnect schemes brought about changes in the interconnect process technology. Since etching of copper is difficult when using subtractive etching methods, 'damascene/dual damascene' processing approaches have evolved. In the damascene process a trench is cut in the dielectric for metal wiring and contact and/or via holes are formed in the dielectric for wiring interconnect. Several different techniques of forming dual damascene structures are known, some of which we describe below:

Prior art method no. 1:

Referring now to FIG. 1a, substrate 11 is coated with dielectric layer 12 and trench 13 is etched therein. This is followed (FIG. 1b) by the application of photoresist layer 14 which is patterned to provide an etch mask with opening 15. All unprotected dielectric is then etched down to the level of substrate 11, thereby forming via hole 16, as seen in FIG. 1c. After the resist has been stripped, the via hole and trench are filled with metal 17 to form the damascene structure (referred to as 'dual' because both hole and trench formation are involved) seen in FIG. 1d.

Prior art method no. 2:

Here, formation of via hole 16 is the first step, as shown in FIG. 2a. Then, as seen in FIG. 2b, photoresist 24 is laid down and patterned to define the trench (FIG. 2c). After trench etching and resist stripping, the trench and via are filled with metal 17 (FIG. 2d).

Prior art method no. 3:

This variation begins with deposition of silicon nitride layer 31 onto dielectric 12, as seen in FIG. 3a, followed by photoresist layer 34 which is patterned to define the via hole. Then the silicon nitride is selectively removed to form hard mask 131 (FIG. 3b) and second dielectric layer 32 is laid down (FIG. 3c). A second photoresist layer 35 is then applied over layer 32 and patterned to define the trench (FIG. 3d). A single etch step is then used to form both the trench 33 and the via hole 36 (FIG. 3e). Then, as before, all resist is removed and trench and via are filled with metal 17 (FIG. 3f).

Prior art method no. 4:

In this fourth prior art approach, the dielectric layer 12 is also coated with silicon nitride 31, following which a layer of positive photoresist 41 is laid down and patterned to define via hole 15 (FIG. 4a). A layer of negative photoresist 42 is deposited over patterned layer 41 and is itself patterned to define trench 13. Because of their different chemistries, patterning of 42 does not impact layer 41 as shown in FIG. 4b. Then, silicon nitride etch stop layer 31 is selectively removed and simultaneous etching of both resists as well dielectric layer proceeds so that trench 33 and via 36 are both formed in a single etching operation (FIG. 4c). Then, as before, all resist is removed and trench and via are filled with metal 17 (FIG. 4d).

While all of these prior art methods are widely used, they all share a single difficulty, namely that they are ineffective for etching via holes having a diameter less than about 0.15 microns. This is because contact and via holes of size 0.18 micron and below are becoming so small in dimension that it is difficult to pattern them (using conventional photolithography techniques) with consistent accuracy and the process repeatability required for ULSI devices. With current photolithography techniques it is very difficult to form via/hole structure without the use of lithography enhancement techniques such as off-axis illumination and attenuated phase shift masking.

Approaches that have been taken towards dealing with this problem include shrinking the via size by deposition of dielectric in the hole opening as taught by Lin in U.S. Pat. No. 05,753,967, and a self-aligned method to form a narrow via (Lu U.S. Pat. No. 5,789,316). In a routine search of the prior art, the following additional references of interest were also found:

In U.S. Pat. No. 5,877,076, Dai describe atwo step process based on a combination of positive and negative resists. Nguyen et al. (U.S. Pat. No. 6,043,164), Dai (U.S. Pat. No. 5,976,968), and Nguyen et al. (U.S. Pat. No. 5,936,707) all disclose two photoresist/one etch dual damascene processes. In U.S. Pat. No. 5,935,762, Dai et al. show a 2 resist layer dual damascene process while, in U.S. Pat. No. 5,882,996, Dai shows a dual damascene bi-layer photoresist process.

SUMMARY OF THE INVENTION

It has been an object of the present invention to solve the problem of how to pattern via/contact holes less than 0.15 um in a damascene structure.

Another object of the invention has been to reduce the process to two lithography steps and one etching step.

These objects have been achieved by the use of e-beam patterning techniques for forming the contact and via holes while using deep ultra violet photolithography patterning techniques for forming the trenches. A simplified process scheme is described wherein contact/via holes are formed first on a solvent developable e-beam resist and the trench pattern is then formed on an aqueous developable photoresist coated on top of said e-beam resist.

BRIEF DESCRIPTION OF THE DRAWINGS

FIGS. 1a–1d show successive steps in the formation of damascene wiring according to the teachings of the prior art.

FIGS. 2a–2d show successive steps of a second prior art method for forming damascene wiring.

FIGS. 3a–3f show successive steps of a third prior art method for forming damascene wiring.

FIGS. 4a–4d show successive steps of a fourth prior art method for forming damascene wiring.

DESCRIPTION OF THE PREFERRED EMBODIMENTS

Figure 5:
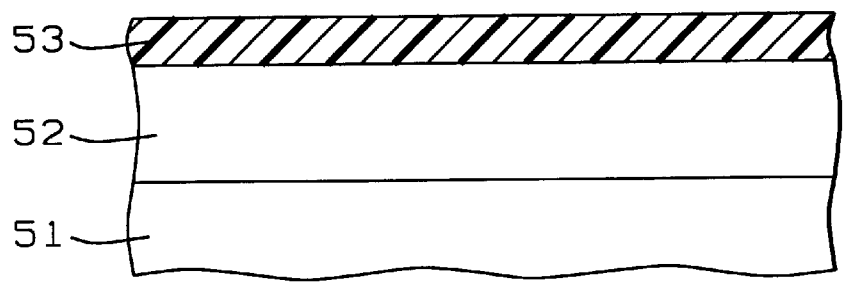
FIG. 5–8, 9A–9D, and 10–11 show successive steps that illustrate a first embodiment of the process of the present invention.

The invention is a general process for forming a dual damascene structure in a dielectric layer. In its most general embodiment, the invention first uses an electron beam together with a positive electron beam resist, to etch a via hole that is less than 0.15 microns wide through a dielectric layer to some particular depth, generally between about 0.5 and 1.25 microns (down to the next lowest wiring level). The via pattern also includes alignment marks for later alignment of the wire/trench pattern. The dielectric is most commonly silicon oxide but the invention is not limited to these. Other dielectrics that could also have been used include barium strontium titanate (BST), CVD (chemical vapor deposition) tantalum oxide, CVD doped tantalum oxide, plasma enhanced (PE) CVD tantalum oxide, fluorinated silicate glass, hydrogen silsesquioxane, spin-on organic polymers, spin-on inorganic dielectrics, CVD carbon doped silicon oxide, Xerogel, surfactant/copolymer templated silicon oxide, fluoropolymers, porous silicon oxide/ polymer composite, porous CVD carbon-doped silicon oxide, and porous dielectrics in general.

Prior to irradiation, the e-beam resist is soft baked (160–200° C. for between about 1 and 4 minutes on a hot plate). The e-beam lithography tool may be a spot beam, a shaped beam, or an e-beam projection lithography system. The electron beam resist is sensitive to e-beam radiation An example of such a resist is ZEP-520 from Nippon Zeon of Japan. Irradiated areas are removed after development in a solvent. An example of a suitable developer is n-butyl acetate followed by rinsing in Methyl Isobutyl Ketone/ Isopropyl solution. The resist is then hard baked (between about 90 and 120° C. for between about 1 and 3 minutes). Then, using ultraviolet light and I-line (deep UV) photoresist, a suitable trench etch mask is created. Since e-beam resist is not sensitive to the wavelengths used for I-line exposure, it is unaffected by this exposure. The photoresist is developed in an aqueous base developer such as 2.38% TMAH (tetra methyl ammonium hydroxide) solution. Exposed resist over contact/via pattern will also be cleared during this development process. Electron-beam resist defining the contact/via hole pattern will not be affected by aqueous base developer as it is not soluble in aqueous developers. The developed photoresist is also hard baked and this mask is used to simultaneously form the contact/via hole (by etching to a depth between about 0.5 and 1.25 microns) and the trench by etching to a depth between about 0.2 and 0.5 microns, following which all resists are removed and the trench and via hole are filled with metal, most commonly by overfilling and then planarizing by means of chem. mech. polishing. Examples of metals that could be used include electrochemically deposited (ECD) copper in combination with physical vapor deposited (PVD) or ionized PVD tantalum, tantalum nitride, titanium nitride, both PVD and CVD tungsten nitride, titanium silicon nitride, tantalum silicon nitride, copper with tungsten silicon nitride barrier layers, enhanced PVD/CVD aluminum, cooled conductors, and superconductors.

Note that although E-beam lithography systems currently have low throughput compared to optical lithography systems, projection lithography tools are presently under development which are capable of very high throughput. Use of these e-beam tools to write critical contact/via holes along with optical lithography systems to write the trench patterns, is therefore anticipated to be capable of cost effective, accurate, and efficient performance. An additional advantage of e-beam lithography is the capability to pattern customized contact/via patterns. E-beam tools do not use masks (as in conventional photolithography) so customized patterning data can be used during exposure on a substrate. This will allow the making of integrated circuits having customized wiring patterns through selective exposure of contact/via holes.

We now describe two specific embodiments of the process of the present invention:

First Embodiment

Figure 6:
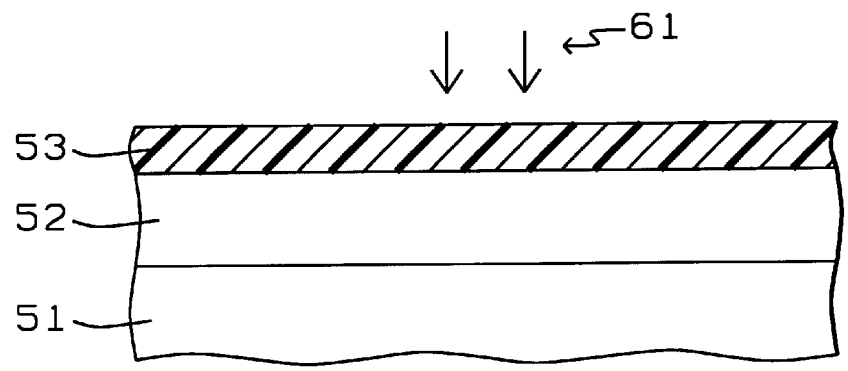

Referring now to FIG. 5, the process for this embodiment begins with the provision of partially completed integrated circuit 51 having on its upper surface a dielectric layer 52 whose thickness is between about 0.7 and 1.75 microns. Dielectric layer 52 is then coated with layer 53 of an electron beam resist followed by soft baking, as described above. By selective exposure to electron beam 61, as seen in FIG. 6, a latent image of the via hole is formed in the electron beam resist, said via hole having a diameter less than about 0.15 microns.

Figure 7:
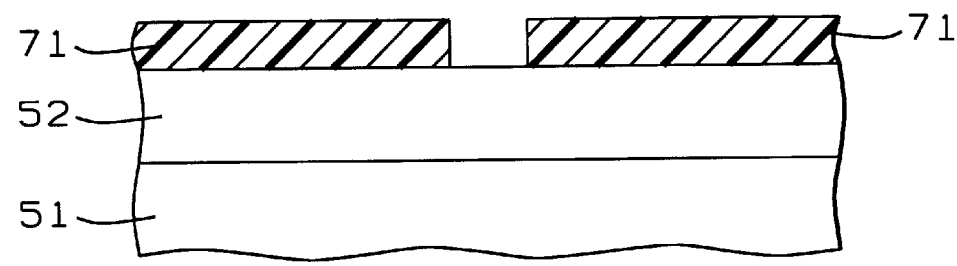
Figure 8:
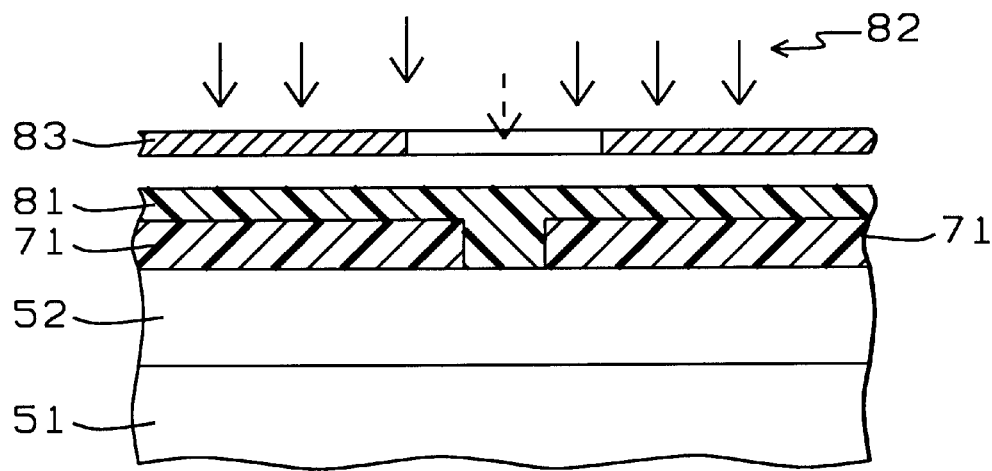
Figure 9A:
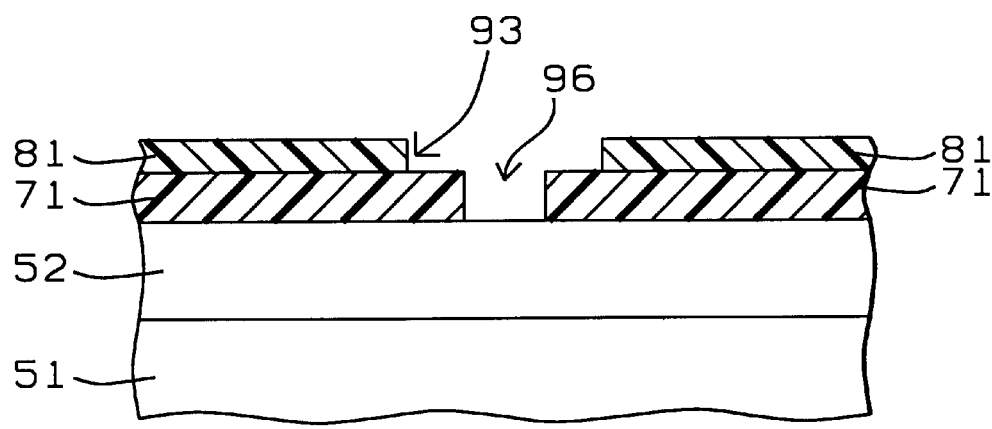
Figure 9B:
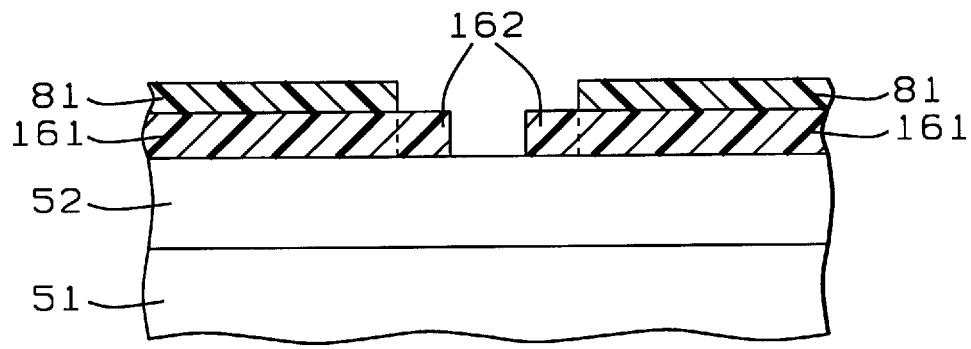
Figure 9C:
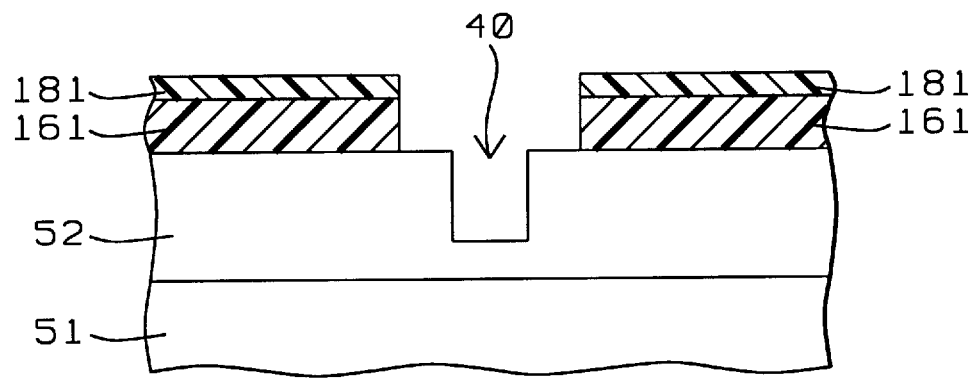
Figure 9D:
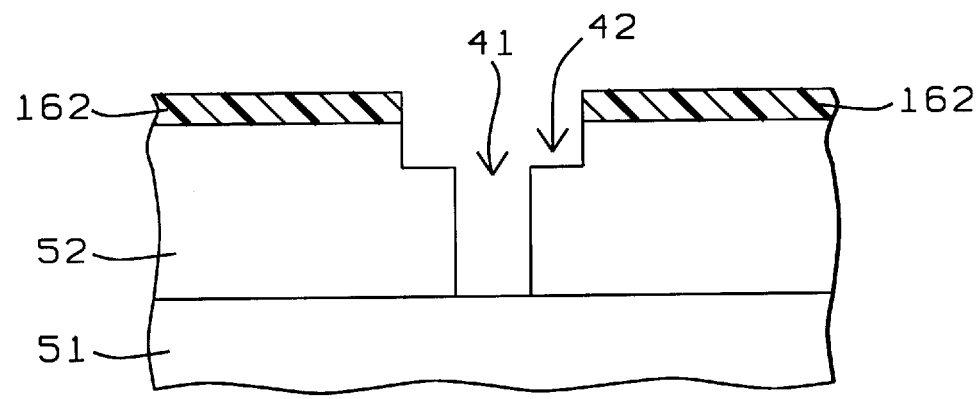

The electron beam resist is developed in a non-aqueous solvent to form etch mask 71 that defines the via hole pattern (see FIG. 7). The developed electron beam resist layer 71 is then coated with photoresist layer 81 (FIG. 8) which is then patterned by exposure to ultraviolet light 82 imaged through mask 83, to form a trench and wiring pattern. These are shown as 93 and 96 respectively in FIG. 9(*a*). The trench is equal to or wider than, and is disposed over, the via hole. The trench has a width between about 0.05 and 0.25 microns and, when completed, a depth of between about 0.2 and 0.5 microns.

Figure 10:
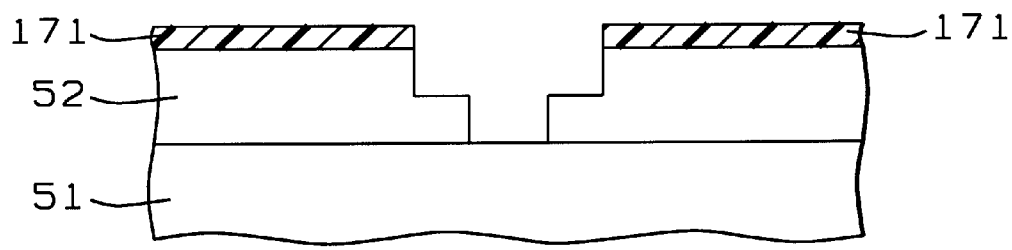

The structure seen in FIG. 9(*a*) is now subjected to reactive ion etching using a chemistry that attacks both the dielectric material 52 as well as both resist layers 71 and 81 whose thicknesses are such that a certain amount of 71 (shown in FIG. 10 as layer 162) remains. As seen in FIG. 9(*b*), layer 161 shows the part of layer 71 which is protected by I-line resist layer 81. Layer 162 is the part of layer 71 which is not protected by I-line resist layer 81. During RIE (reactive ion etch) of contact/via holes all of layer 162 and part of layer 81 is etched away (see FIG. 9(*c*)). The contact/ via etch is partial and is shown as layer 40.

Thus, RIE proceeds with simultaneous etching of via and trench. Etching stops when the trench and via depths shown in layers 42 and 41 respectively, are achieved (FIG. 9(*d*)). The depths of contact/via hole and trench are controlled by choosing the right resist thicknesses, depending on etch selectivity between the e-beam resist, the I-line resist, and the silicon oxide. An example of a RIE process suitable for this selective three material etch is as follows:

CHF3, CF4 and Ar gases at flow rates of 30–50 sccm, 10–20 sccm and 130–170 sccm respectively, at a chamber pressure of 180–220 mtorr, with RF power of 600–800 wafts. The RIE process is adjusted to have a very high etch rate for silicon oxide relative to the two resists.

Figure 11:
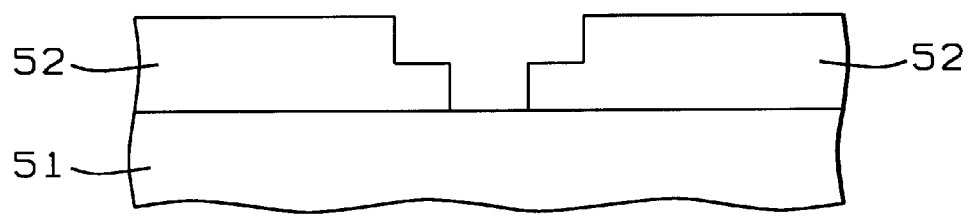

In this way both the trench and the via hole are formed at the same time. After stripping away all remaining resists, the structure has the appearance shown in FIG. 11. All that remains is to fill the trench and via hole with metal, thereby forming the damascene wiring.

Second Embodiment

Figure 12:
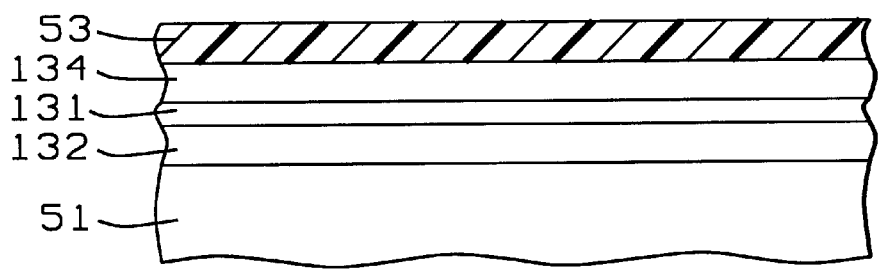
FIGS. 12–20 show successive steps that illustrate a second embodiment of the process of the present invention.

Referring now to FIG. 12, this embodiment also begins With the provision of partially completed integrated circuit 51 on whose upper surface is first layer 132 of silicon oxide. This is coated with silicon nitride layer 131, followed by second of silicon oxide layer 134. The thickness of first silicon oxide layer 132 is between about 0.5 and 1.25 microns, that of silicon nitride 131 is between about 0.02 and 0.2 microns, and that of second silicon oxide layer 134 is between about 0.2 and 0.5 microns. The latter is then coated with layer 53 of an electron beam resist which is then soft baked, as discussed earlier. Dielectric layers 131 and 132 are, most commonly, silicon oxide other dielectric materials such as BST, CVD tantalum oxide, CVD doped tantalum oxide, PECVD tantalum oxide, fluorinated silicate glass, hydrogen silsesquioxane, spin-on organic polymers, spin-on inorganic dielectrics, CVD carbon doped silicon oxide, Xerogel, surfactant/copolymer templated silicon oxide, fluoropolymers, porous silicon oxide/polymer composite, porous CVD carbon-doped silicon oxide, and porous dielectrics in general, could also have been used.

Figure 13:
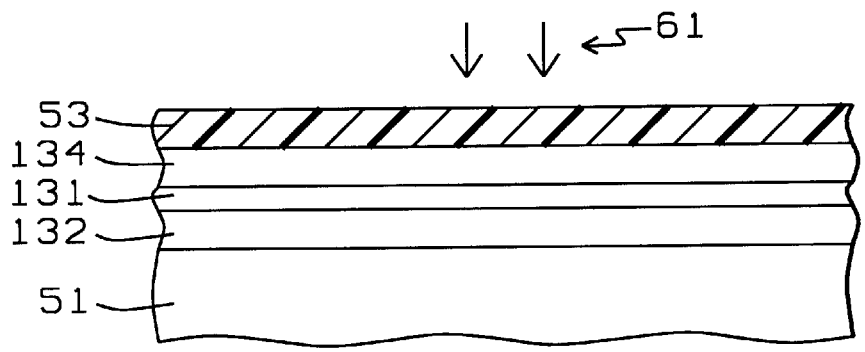
Figure 14:
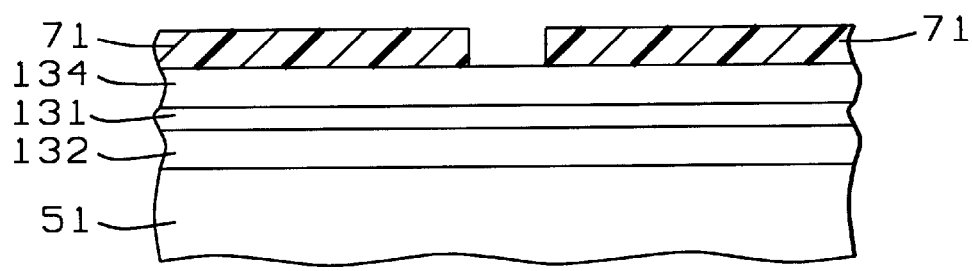
Figure 15:
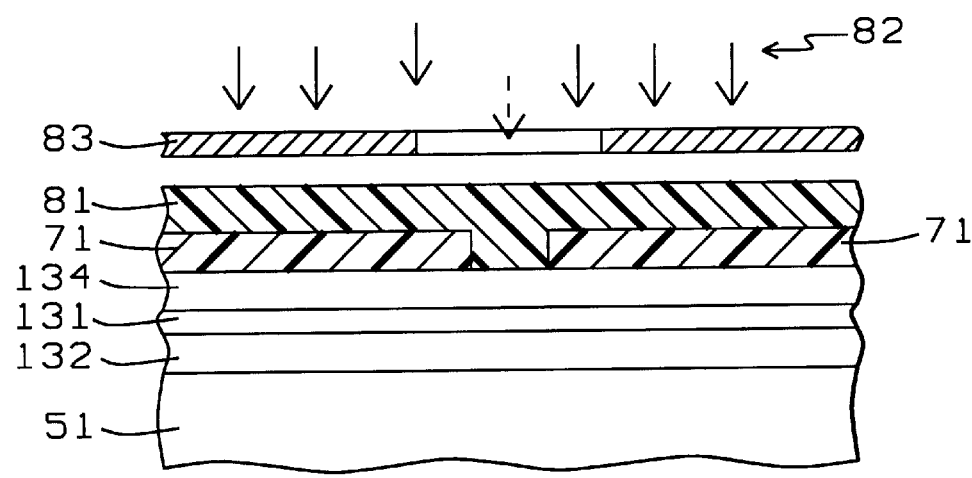

By selective exposure to electron beam 61, as seen in FIG. 13, a latent image of the via hole is formed in the electron beam resist, said via hole having a diameter less than about 0.15 microns. The electron beam resist is developed in a non-aqueous solvent to form etch mask 71 that defines the via hole pattern (see FIG. 14). The developed electron beam resist layer 71 is then coated with photoresist layer 81 (FIG. 15) which is then patterned by exposure to ultraviolet light 82 imaged through mask 83, to form a trench and wiring pattern. These are shown as 93 and 96 respectively in FIG. 16. The trench is equal to or wider than the via hole. The trench has a width between about 0.05 and 0.25 microns and, when completed, a depth of between about 0.2 and 0.5 microns.

Figure 16:
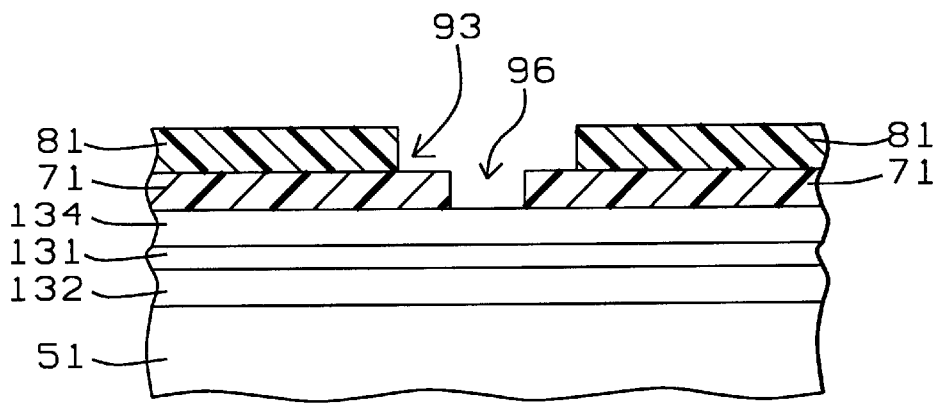
Figure 17:
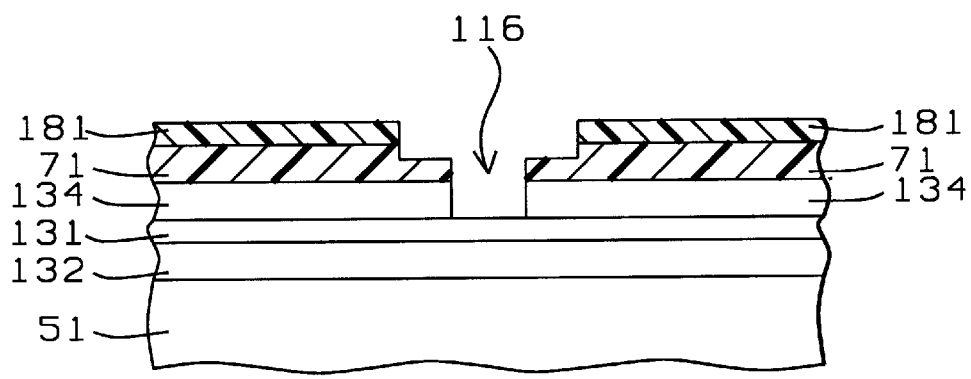
Figure 18:
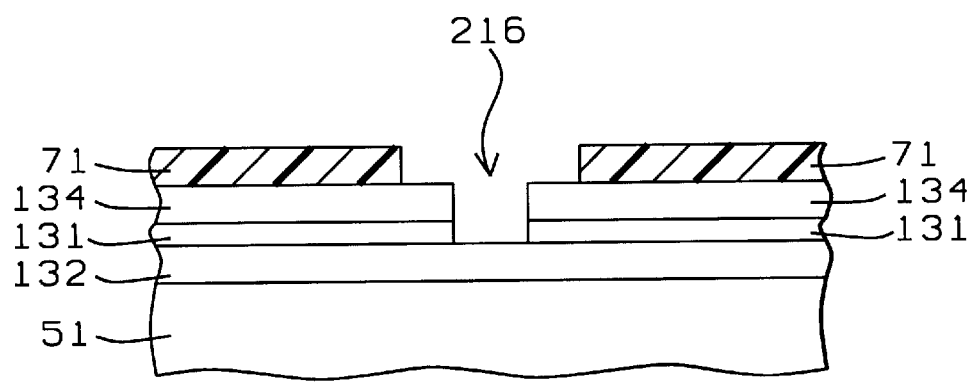

The structure seen in FIG. 16 is now subjected to reactive ion etching using a chemistry that attacks both layer 134 as well as both resist layers 71 and 81, which results in the simultaneous removal of between about 30 and 80% of the unprotected electron beam resist and between about 30 and 80% of the photoresist, but without attacking the silicon nitride layer 131 which thus acts as an etch stop layer, so that partial via hole 116 is formed. This is followed by the selective removal of all unprotected silicon nitride together with all or part of unprotected electron beam resist 71 and all or part of remaining photoresist 181, resulting in a somewhat deeper partial via hole 216, as seen in FIG. 18. Note that it is not necessary to remove all the unprotected E-beam or photo resist. After removal of the unprotected silicon nitride via etch commences. The E-beam resist is etched during this step and trench formation then begins.

Figure 19:
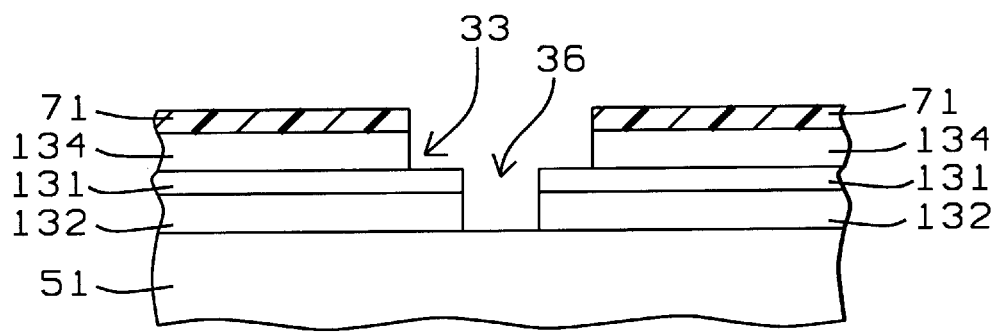

Then, all unprotected areas of silicon oxide of layer 134, down to the level of silicon nitride layer 131 are removed, thereby forming the trench 33, along with all unprotected areas of silicon oxide layer 132, down to the upper surface of 51, thereby forming via hole 36 and giving the structure the appearance illustrated in FIG. 19.

Figure 20:
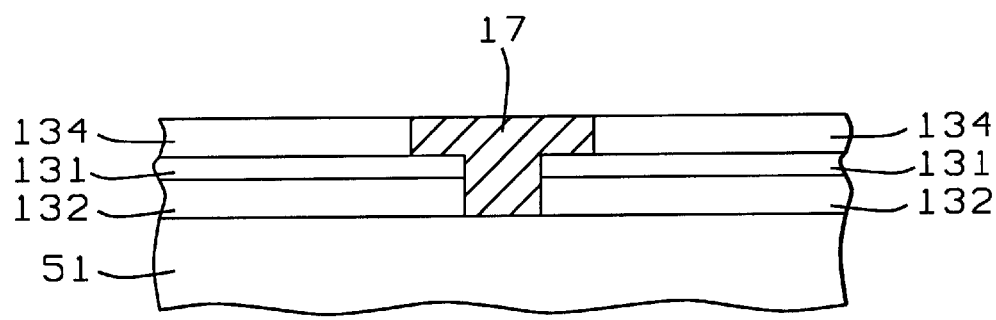

After stripping away all remaining resists 171, all that remains is to fill the trench and via hole with metal 17, as discussed above, thereby forming the damascene wiring structure shown in FIG. 20.

While the invention has been particularly shown and described with reference to the preferred embodiments thereof, it will be understood by those skilled in the art that various changes in form and details may be made without departing from the spirit and scope of the invention.

What is claimed is:

1. A process for forming a dual damascene structure in a dielectric layer, comprising the sequential steps of:
   using an electron beam and an electron beam resist, etching a via hole that is less than 0.15 microns wide through said dielectric layer to a first depth;
   using ultraviolet light and a photoresist, etching a trench that is as least as wide as said via hole, to a second depth that is less than said first depth;
   removing all resists; and
   filling the trench and via hole with metal.

2. The process described in claim 1 wherein the first depth is between about 0.5 and 1.25 microns.

3. The process described in claim 1 wherein the second depth is between about 0.2 and 0.5 microns.

4. The process described in claim 1 wherein the dielectric is selected from the group consisting of BST, CVD tantalum oxide, CVD doped tantalum oxide, PECVD tantalum oxide, fluorinated silicate glass, hydrogen silsesquioxane, spin-on organic polymers, spin-on inorganic dielectrics, CVD carbon doped silicon oxide, Xerogel, surfactant/copolymer templated silicon oxide, fluoropolymers, porous silicon oxide-polymer composites, and porous CVD carbon-doped silicon oxide.

5. A process for forming damascene wiring in an integrated circuit, comprising the sequential steps of:
   providing a partially completed integrated circuit having an upper surface on which is a dielectric layer having a thickness;
   coating said dielectric layer with a layer of electron beam resist and soft baking the electron beam resist;
   by selective exposure to an electron beam, forming a latent image of a via hole in the electron beam resist, said via hole having a diameter less than about 0.15 microns;
   developing the electron beam resist in a non-aqueous solvent, thereby forming a via hole pattern;
   coating the developed electron beam resist layer with a layer of photoresist and then patterning said photoresist, through exposure to ultraviolet light, to form a trench and wiring pattern, said trench being at least as wide as said via hole;
   by means of reactive ion etching, removing all unprotected dielectric down to the level of said upper surface, thereby forming the via hole while simultaneously removing all unprotected electron beam resist, thereby exposing, and then etching, additional dielectric down to a depth less than said thickness and thereby forming the trench;
   stripping away all remaining resists; and
   filling the trench and via hole with metal, thereby forming the damascene wiring.

6. The process described in claim 5 wherein the dielectric layer has a thickness between about 0.7 and 1.75 microns.

7. The process described in claim 5 wherein the step of soft baking the electron beam resist further comprises using a hot plate at a temperature between about 160 and 200° C. for between about 1 and 4 minutes.

8. The process described in claim 5 wherein the trench has a width between about 0.05 and 0.25 microns.

9. The process described in claim 5 wherein the trench has a depth between about 0.2 and 0.5 microns.

10. The process described in claim 5 wherein the step of reactive ion etching further comprises using CHF3, CF4 and Ar gases at flow rates of 30–50 sccm, 10–20 sccm and 130–170 sccm respectively, at a chamber pressure of 180–220 mtorr, with RF power of 600–800 watts, whereby said process has a very high etch rate for silicon oxide relative to the electron beam and photo resists.

11. The process described in claim 5 wherein the metal used to fill the trench is selected from the group consisting of ECD copper in combination with PVD tantalum, tantalum nitride, titanium nitride, PVD tungsten nitride, CVD tungsten nitride, titanium silicon nitride, tantalum silicon nitride, copper with tungsten silicon nitride barrier layers, enhanced PVD/CVD aluminum, cooled conductors, and superconductors.

12. A process for forming damascene wiring in an integrated circuit, comprising the sequential steps of:

providing a partially completed integrated circuit having an upper surface on which is a first layer of silicon oxide;

coating said first silicon oxide layer with a layer of silicon nitride;

coating the silicon nitride layer with a second layer of silicon oxide having a second thickness;

coating said silicon oxide layer with a layer of electron beam resist and soft baking the electron beam resist;

by selective exposure to an electron beam, forming a latent image of a via hole in the electron beam resist, said via hole having a diameter less than about 0.15 microns;

developing the electron beam resist in a non-aqueous solvent, thereby forming a via hole pattern;

coating the developed electron beam resist layer with a layer of photoresist and then patterning said photoresist, through exposure to ultraviolet light, to form a trench and wiring pattern, said trench being at least as wide as said via hole;

by means of reactive ion etching, removing all unprotected silicon oxide down to the level of said silicon nitride layer while simultaneously removing a first percentage of the unprotected electron beam resist and a second percentage of the photoresist;

simultaneously removing all exposed silicon nitride and all unprotected electron beam resist;

removing all unprotected second silicon oxide down to the level of the silicon nitride layer, thereby forming the trench, and all unprotected first silicon oxide down to the level of said upper surface, thereby forming the via hole;

stripping away all remaining resists; and filling the trench and via hole with metal, thereby forming the damascene wiring.

13. The process described in claim 12 wherein the thickness said first layer of silicon oxide is between about 0.5 and 1.25 microns.

14. The process described in claim 12 wherein the thickness said layer of silicon nitride is between about 0.02 and 0.2 microns.

15. The process described in claim 12 wherein the thickness said second layer of silicon oxide is between about 0.2 and 0.5 microns.

16. The process described in claim 12 wherein the first percentage of unprotected electron beam resist thickness that is removed is between about 30 and 80%.

17. The process described in claim 12 wherein the second percentage of photoresist thickness that is removed is between about 30 and 80%.

18. The process described in claim 12 wherein the step of soft baking the electron beam resist further comprises using a hot plate at a temperature between about 160 and 200° C. for between about 1 and 4 minutes.

19. The process described in claim 12 wherein the trench has a width between about 0.05 and 0.25 microns.

20. The process described in claim 12 wherein the step of reactive ion etching further comprises using CHF3, CF4 and Ar gases at flow rates of 30–50 sccm, 10–20 sccm and 130–170 sccm respectively, at a chamber pressure of 180–220 mtorr, with RF power of 600–800 watts, whereby said process has a very high etch rate for silicon oxide relative to the electron beam and photo resists.

* * * * *